United States Patent
Lee

(10) Patent No.: US 8,674,752 B2
(45) Date of Patent: Mar. 18, 2014

(54) SEMICONDUCTOR DEVICE AND METHOD FOR DRIVING THE SAME

(71) Applicant: SK hynix Inc., Gyeonggi-do (KR)

(72) Inventor: Jeong-Hun Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/684,015

(22) Filed: Nov. 21, 2012

(65) Prior Publication Data

US 2014/0028385 A1 Jan. 30, 2014

(30) Foreign Application Priority Data

Jul. 30, 2012 (KR) .................. 10-2012-0083003

(51) Int. Cl.
G05F 1/10 (2006.01)
(52) U.S. Cl.
USPC .......................................... 327/540; 327/143
(58) Field of Classification Search
USPC ................ 327/143, 530, 534, 536, 539, 540
See application file for complete search history.

(56) References Cited

U.S. PATENT DOCUMENTS 7,770,044 B2 * 8/2010 Bibikar et al. ................ 713/330
7,971,086 B2 * 6/2011 Itkin ............................. 713/330

FOREIGN PATENT DOCUMENTS

| KR | 1020010105564 | 11/2001 |
| KR | 1020040070615 | 8/2004 |
| KR | 1020050060902 | 6/2005 |

* cited by examiner

*Primary Examiner* — Jeffrey Zweizig
(74) *Attorney, Agent, or Firm* — IP & T Group LLP

(57) ABSTRACT

A semiconductor device includes an internal voltage generation unit configured to generate an internal voltage in response to an enable signal, an enable setting logic unit configured to define a starting time point for generating the internal voltage in response to the enable signal, a monitoring unit configured to monitor whether or not the internal voltage reaches a target level, and define an ending time point for generating the internal voltage in response to the monitoring result, and a measurement result signal generation unit configured to generate a measurement result signal corresponding to a developing time of the internal voltage in response to an output signal of the enable setting logic unit and an output signal of the monitoring unit.

16 Claims, 4 Drawing Sheets

SEMICONDUCTOR DEVICE AND METHOD FOR DRIVING THE SAME

CROSS-REFERENCE TO RELATED APPLICATIONS

The present application claims priority of Korean Patent Application No. 10-2012-0083003, filed on Jul. 30, 2012, which is incorporated herein by reference in its entirety.

BACKGROUND

1. Field

Exemplary embodiments of the present invention relate to a semiconductor design technology, and more particularly, to a semiconductor device for measuring a developing time of an internally-generated voltage and a method for driving the same.

2. Description of the Related Art

In general, a semiconductor memory device such as Dynamic Random Access Memory (DRAM) internally generates a reference voltage required for a memory operation. An enable period of a circuit for generating the reference voltage (hereinafter, referred to as a reference voltage generation circuit) has been limited to achieve low power consumption. Therefore, a time required until the reference voltage reaches a desired target level from a predetermined initial level when the reference voltage generation circuit is enabled to generate the reference voltage may be used as important information for system design, when the time can be measured precisely. Hereafter, the time is referred to as a developing time. For example, if accurate information on the developing time of the reference voltage can be obtained, the information may be useful for programming a write operation after a self-refresh mode is ended.

Conventionally, a test device or oscilloscope has been used to measure a developing time of a reference voltage. However, to measure the developing time of the reference voltage by using the test device or oscilloscope, a probe tip of the test device or oscilloscope has to be connected to a corresponding pad. Therefore, it may be difficult to precisely measure the developing time of the reference voltage due to loading caused by the probe tip and other parasitic loadings.

SUMMARY

Exemplary embodiments of the present invention are directed to a semiconductor device capable of precisely measuring a developing time of an internally-generated reference voltage without distortion and a method for driving the same.

In accordance with an embodiment of the present invention, a semiconductor device includes an internal voltage generation unit configured to generate an internal voltage in response to an enable signal, an enable setting logic unit configured to define a starting time point for generating the internal voltage in response to the enable signal, a monitoring unit configured to monitor whether or not the internal voltage reaches a target level in response to the enable signal, and define an ending time point for generating the internal voltage in response to the monitoring result, and a measurement result signal generation unit configured to generate a measurement result signal corresponding to a developing time of the internal voltage in response to an output signal of the enable setting logic unit and an output signal of the monitoring unit.

In accordance with another embodiment of the present invention, a semiconductor device includes an internal voltage generation unit configured to generate an internal voltage in response to an enable signal and a voltage setting code, an enable setting logic unit configured to define a starting time point for generating the internal voltage in response to the enable signal and the voltage setting code, a comparison reference voltage generation unit configured to generate a comparison reference voltage in response to the enable signal, a comparison unit configured to compare the internal voltage with the comparison reference voltage and define an ending time point for generating the internal voltage in response to the comparison result, and a measurement result signal generation unit configured to output a developing time of the internal voltage corresponding to a voltage level duration defined by the voltage setting code as a measurement result signal in response to an output signal of the enable setting logic unit and an output signal of the comparison unit.

In accordance with yet another embodiment of the present invention, a method for driving a semiconductor device includes generating an internal voltage at a lower voltage level in response to a first voltage setting code when an enable signal is activated, defining a starting time point for generating the internal voltage, and developing the internal voltage to an upper voltage level in response to the second voltage setting code when the first voltage setting code is changed to a second voltage setting code, monitoring whether the internal voltage reaches the upper voltage level or not, and defining an ending time point for generating the internal voltage in response to the monitoring result, and generating a measurement result signal in response to the starting time point and the ending time point for generating the internal voltage.

DETAILED DESCRIPTION

Figure 1:
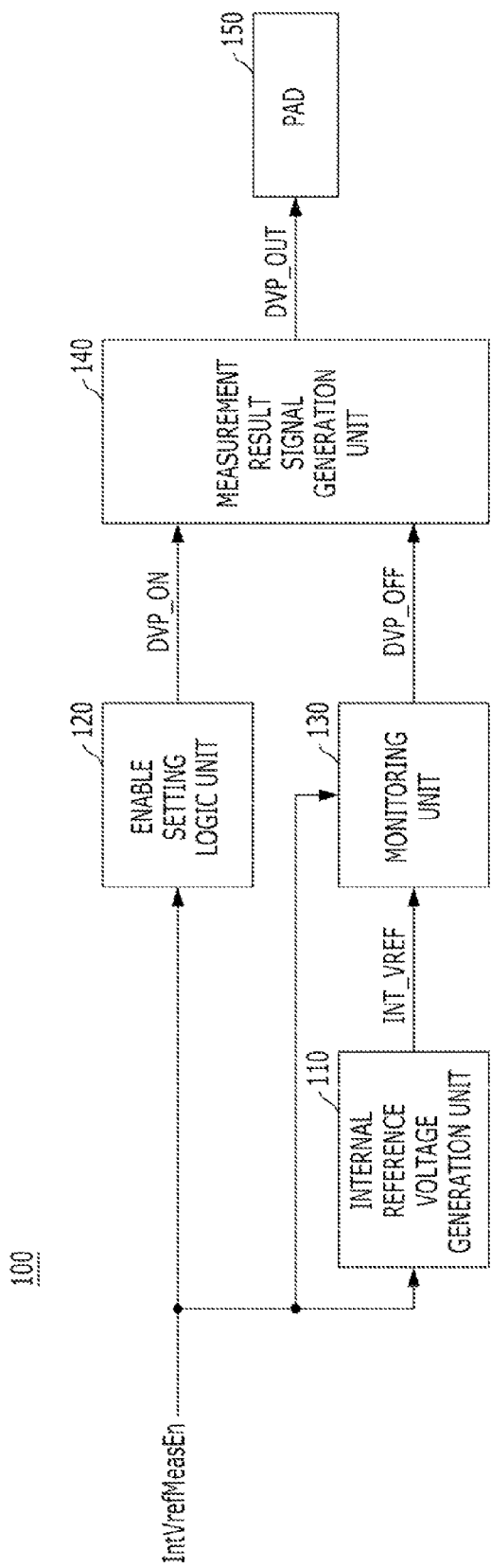
FIG. 1 is a block diagram illustrating a semiconductor device in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a block diagram illustrating a semiconductor device accordance with an embodiment of the present invention.

Referring to FIG. 1, the semiconductor device 100 includes an internal reference voltage generation unit 110, an enable setting logic unit 120, a monitoring unit 130, a measurement result signal generation unit 140 and a pad 150.

The internal reference voltage generation unit 110 is configured to generate an internal reference voltage INT_VREF used for internal circuits (not illustrated). The enable setting logic unit 120 is configured to define a starting time point for generating the internal reference voltage INT_VREF in response to an enable signal IntVrefMeasEn. The monitoring unit 130 is configured to monitor whether the internal reference voltage INT_VREF reaches a target level or not, in response to the enable signal IntVrefMeasEn, and define an ending time point for generating the internal reference voltage INT_VREF in response to the monitoring result. The measurement result signal generation unit 140 is configured to output a measurement result signal DVP_OUT, corresponding to a developing time of the internal reference voltage INT_VREF to the pad 150 in response to an output signal DVP_ON of the enable setting logic unit 120 and an output signal DVP_OFF of the monitoring unit 130.

The monitoring unit 130 may define the ending time point for generating the internal voltage by continuously detecting an internal reference voltage INT_VREF.

The measurement result signal DVP_OUT may be outputted as a DC-level signal.

Figure 2:
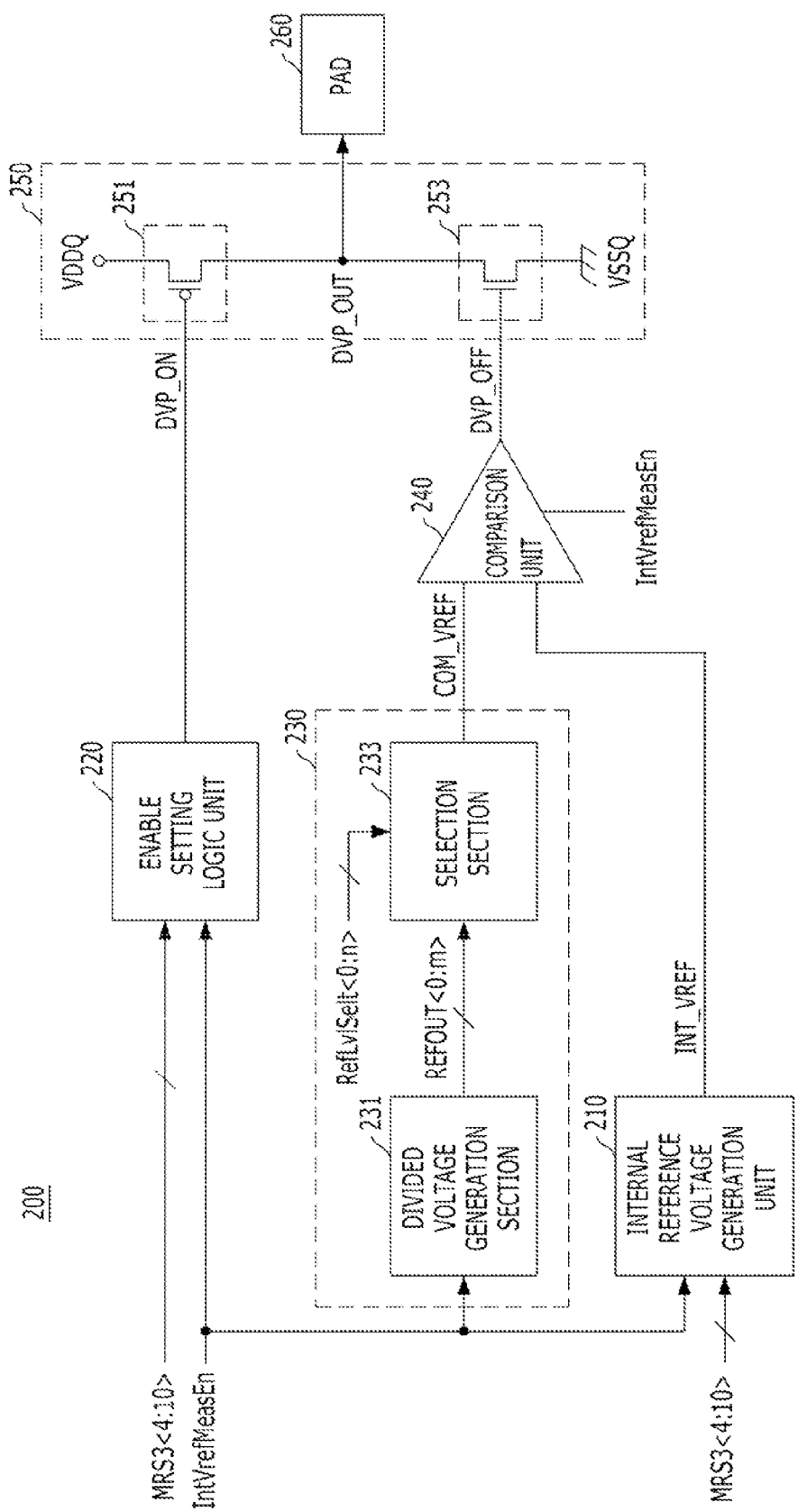
FIG. 2 is a block diagram illustrating a semiconductor device accordance with another embodiment of the present invention.

FIG. 2 is a block diagram illustrating a semiconductor device in accordance with another embodiment of the present invention.

Referring to FIG. 2, the semiconductor device 200 includes an internal reference voltage generation unit 210, an enable setting logic unit 220, a comparison reference voltage generation unit 230, a comparison unit 240, a measurement result signal generation unit 250, and a pad 260.

The internal reference voltage generation unit 210 is configured to generate an internal reference voltage INT_VREF in response to an enable signal IntVrefMeasEn and a voltage setting code MRS3<4:10>. The enable setting logic unit 220 is configured to define a starting time point for generating the internal reference voltage INT_VREF in response to the enable signal IntVrefMeasEn and the voltage setting code MRS3<4:10>. The comparison reference voltage generation unit 230 is configured to generate a comparison reference voltage COM_VREF corresponding to a target level of the internal reference voltage INT_VREF in response to the enable signal IntVrefMeasEn. The comparison unit 240 is configured to compare the internal reference voltage INT_VREF with the comparison reference voltage COM_VREF to define an ending time point for generating the internal reference voltage INT_VREF in response to the comparison result. The measurement result signal generation unit 250 is configured to output a developing time of the internal reference voltage INT_VREF, corresponding to a voltage level duration defined by the voltage setting code MRS3<4:10>, as a measurement result signal DVP_OUT in response to an output signal DVP_ON of the enable setting logic unit 220 and an output signal DVP_OFF of the comparison unit 240. The pad 260 is configured to provide the measurement result signal DVP_OUT to the outside.

The internal reference voltage generation unit 210 generates the internal reference voltage INT_VREF in response to the voltage setting code MRS3<4:10> in a state where the internal reference voltage generation unit 210 is enabled in response to the enable signal IntVrefMeasEn. In particular, the internal reference voltage generation unit 210 generates a lower voltage level defined in the voltage setting code MRS3<4:10> as an initial level, and generates an upper voltage level defined in the voltage setting code MRS3<4:10> as a target level. The time it takes for the lower voltage level to reach the upper voltage level (hereinafter, referred to as a voltage level duration) corresponds to a duration in which the developing time of the internal reference voltage INT_VREF is to be measured.

The enable setting logic unit 220 activates a developing time start signal DVP_ON when the voltage setting code MRS3<4:10> corresponding to the upper voltage level is inputted in a state in which the enable setting logic unit 220 is enabled in response to the enable signal IntVrefMeasEn. In other words, the enable setting logic unit 220 activates the developing time start signal DVP_ON when the voltage setting code MRS3<4:10> corresponding to the upper voltage level is applied in a state in which the enable setting logic unit 220 is enabled, and deactivates the developing time start signal DVD_ON when the voltage setting code MRS3<4:10> corresponding to other voltage levels is applied.

The comparison reference voltage generation unit 230 includes a divided voltage generation section 231 and a selection section 233. The divided voltage generation section 231 is configured to generate a plurality of divided voltages REFOUT<0:m> in response to the enable signal IntVrefMeasEn. The selection section 233 is configured to select one of the plurality of divided voltages REFOUT<0:m> in response to a voltage select code RefLvlSelt<0:n>.

The divided voltage generation section 231 generates the plurality of divided voltages REFOUT<0:m> corresponding to the target level of the internal reference voltage INT_VREF. The developing time of the internal reference voltage INT_VREF is to be measured by using the target level of the internal reference voltage INT_VREF, which refers to a given upper voltage level in the voltage in level duration. Therefore, the divided voltage generation section 231 generates the plurality of divided voltages REFOUT<0:m> corresponding to the given upper voltage level.

The selection section 233 selects one of the plurality of divided voltages REFOUT<0:m>, which corresponds to the target level of the current internal reference voltage INT_VREF, in response to the voltage select code RefLvlSelt<0:n>, and provides the selected divided voltage as the comparison reference voltage COM_VREF to the comparison unit 240. For example, when eight divided voltages REFOUT<0:7> are generated by the divided voltage generation section 231, a three-bit voltage select code RefLvlSelt<0:2> may be applied to select any one of the eight divided voltages REFOUT<0:7>. The selection section 233 may include a multiplexer.

The comparison unit 240 compares the internal reference voltage INT_VREF with the comparison reference voltage COM_VREF, and activates the developing time end signal DVP_OFF when the internal reference voltage INT_VREF reaches a level of the comparison reference voltage COM_VREF in response to the comparison result. In other words, the comparison unit 240 deactivates the developing time end signal DVP_OFF when the internal reference voltage INT_VREF is lower than the comparison reference voltage COM_VREF, and activates the developing time end signal DVP_OFF when the internal reference voltage INT_VREF reaches the comparison reference voltage COM_VREF. The comparison unit 240 may include a general differential amplifier.

The measurement result signal generation unit 250 includes a pull-up driving section 251 and a pull-down driving section 253. The pull-up driving section 251 is configured to drive the pad 260 to a high source voltage (for example, VDDQ) in response to the developing time start signal DVP_ON. The pull-down driving section 253 is configured to drive the pad 260 to a low source voltage (for example, VSSQ) in response to the developing time end signal DVD_OFF. The pull-up driving section 251 may include a PMOS transistor having a gate configured to receive the developing time start signal DVP_ON and a source and drain path connected between the high source voltage terminal and the pad 260. The pull-down driving section 253 may include an NMOS transistor having a gate configured to receive the developing time end signal DVP_OUT and a source and drain path connected between the low source voltage terminal and the pad 260. The measurement result signal generation unit 250 configured in such a manner outputs the measurement result signal DVP_OUT of DC-level to the pad 260 in response to the developing time start signal DVP_ON and the developing time end signal DVP_OFF.

The pad 260 may include a dedicated pad for outputting the measurement result signal DVP_OUT to the outside, or an undedicated pad that is not used when the developing time of the internal reference voltage INT_VREF is measured. For example, the undedicated pad refers to a pad used in a different operation mode, such as a data input/output pad DQ. When the undedicated pad is used in an embodiment of present invention, a pad disposed the closest to the internal reference voltage generation unit 210 may be used.

Figure 3:
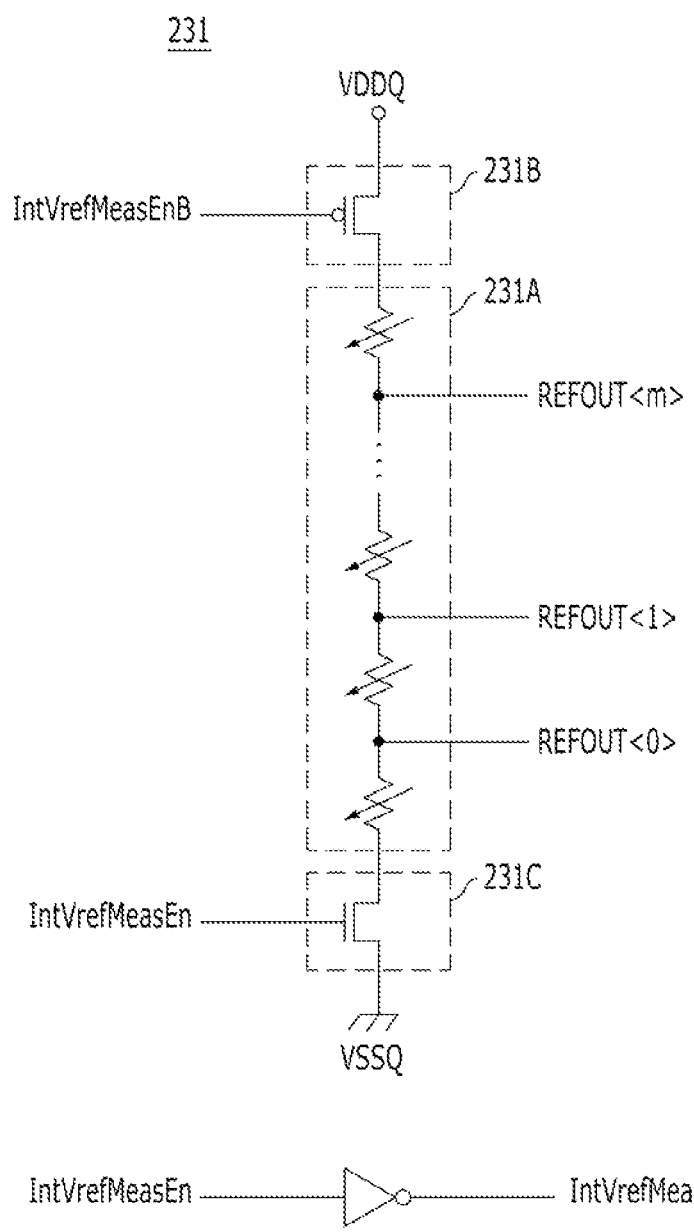
FIG. 3 is a detailed diagram of a divided voltage generation section of FIG. 2.

FIG. 3 is a detailed diagram of the divided voltage generation section 231.

Referring to FIG. 3, the divided voltage generation section 231 includes a divider 231A, a first switch 231B, and a second switch 231C. The divider 231A is configured to divide a voltage supplied across the high source voltage terminal VDDQ and the low source voltage terminal VSSQ at a predetermined division ratio, and generate the plurality of divided voltages REFOUT<0:m>. The first switch 231B is configured to selectively connect the high source voltage terminal to one end of the divider 231A in response to an inverted enable signal IntVrefMeasEnB. The second switch 231C is configured to selectively connect the low source voltage terminal to the other end of the divider 231A in response to the enable signal IntVrefMeasEn. The divider 231A includes a plurality of variable resistors connected in series, and nodes between the respective variable resistors correspond to output nodes for outputting the respective divided voltages REFOUT<0:m>. The first switch 231B includes a POMS transistor having a gate configured to receive the inverted enable signal IntVrefMeasEnB and a source and drain path connected between the high source voltage terminal and the one end of the divider 231A. The second switch 231C includes an NMOS transistor having a gate configured to receive the enable signal IntVrefMeasEn and a source and drain path connected between the low source voltage terminal and the other end of the divider 231A. Since the divided voltage generation section 231 includes the plurality of resistors, the divided voltage generation section 231 may be resistant to process variations.

Figure 4:
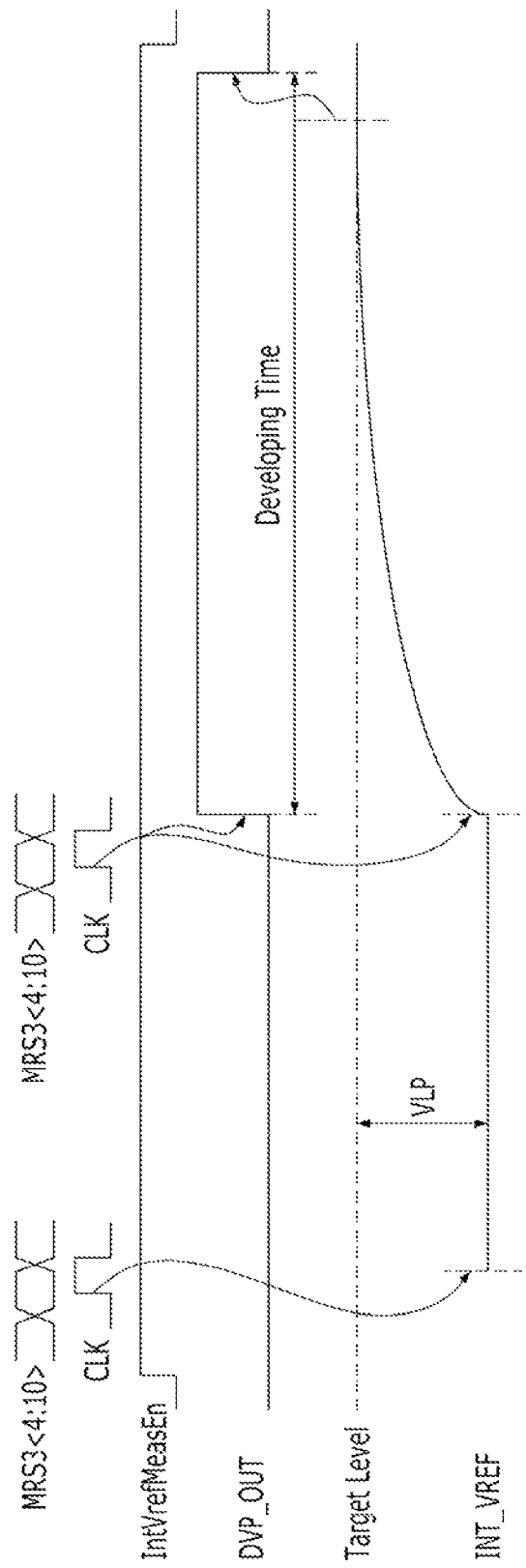
FIG. 4 is a timing diagram illustrating an operation of the semiconductor device of FIG. 2.

FIG. 4 is a timing diagram illustrating an operation the semiconductor device of FIG. 2.

Referring to FIG. 4, when the enable signal IntVrefMeasEn is activated, the internal reference voltage generation unit 210, the enable setting logic unit 220, the comparison reference voltage generation unit 230, and the comparison unit 240 are enabled. Then, the enable setting logic unit 220 deactivates the developing time start signal DVP_ON, the comparison reference voltage generation unit 230 generates the comparison reference voltage COM_VREF corresponding to the target level of the internal reference voltage INT_VREF in response to the voltage setting code MRS3<4:10>, and the comparison unit 240 deactivates the developing time end signal DVP_OFF.

In such a state, when the voltage setting code MRS3<4:10> corresponding to the lower voltage level is inputted, the internal reference voltage generation unit 210 generates the internal reference voltage INT_VREF at the lower voltage level. At this time, the enable setting logic unit 210 continuously deactivates the developing time start signal DVP_ON, as the voltage setting code MRS3<4:10> corresponding to the lower voltage level is inputted.

Then, when the voltage setting code MRS3<4:10> corresponding to the lower voltage level is changed to the voltage setting code MRS3<4:10> corresponding to the upper voltage level, the internal reference voltage generation unit 210 develops the internal reference voltage INT_VREF at the lower voltage level into the Internal reference voltage INT_VREF at the upper voltage level. At this time, the enable setting logic unit 220 activates the developing time start signal DVP_ON, as the voltage setting code MRS3<4:10> corresponding to the upper voltage level is inputted. Furthermore, the measurement result signal generation unit 250 activates the measurement result signal DVP_OUT in response to the developing time start signal DVP_ON. More specifically, as the developing time start signal DVP_ON is activated to a logic low level the pull-up driving section 251 drives the pad 260 to the high source voltage (for example, VDDQ). At this time, the high-level measurement result signal DVP_OUT may be outputted through the pad 260.

Furthermore, the comparison unit 240 continuously monitors whether the internal reference voltage INT_VREF reaches the level of the comparison reference voltage COM_VREF or not. When the internal reference voltage INT_VREF reaches the level of the comparison reference voltage COM_VREF, the comparison unit 240 activates the developing time end signal DVP_OFF. Then, the measurement result signal generation unit 250 deactivates the measurement result signal DVP_OUT in response to the developing time end signal DVP_OFF. More specifically, as the developing time end signal DVP_OFF is activated to a logic high level, the pull-down driving section 253 drives the pad 260 to the low source voltage (for example, VSSQ). At this time, the low-level measurement result signal DVP_OUT may be outputted through the pad 260.

As a result, the time from the time point when the developing time start signal DVP_ON is activated to the time point when the developing time end signal DVP_OFF is activated becomes the developing time of the internal reference voltage INT_VREF, corresponding to the predetermined voltage level duration VLP. The developing time may be defined as the activation period of the measurement result signal DVP_OUT outputted at the DC level.

In accordance with the embodiments of the present invention, since the measurement result signal corresponding to the developing time of the internal reference voltage may be provided as a DC-level signal to the outside, the developing time may be precisely measured during a test mode.

Furthermore, the developing time of the internally-generated reference voltage is measured to output the DC-level signal to the outside. Therefore, it may be possible to obtain a more accurate measurement result than when a test device or oscilloscope is directly used to measure the developing time, because there is no distortion caused by loading of a probe tip. Furthermore, as the accurate developing time of the reference voltage may be obtained, the developing time may be useful for system design.

In the embodiments of the present invention, the internally-generated reference voltage was taken as an example, but the present invention is not limited thereto. The present invention may be applied to a circuit for generating an internal voltage, which reaches a target level through a developing process, as the circuit is switched from a disabled state to an enabled state.

Furthermore, it has been described that the same voltage setting code MRS3<4:10> applied to the enable setting logic unit 220 is applied to the internal reference voltage generation unit 210, but the present invention is not limited thereto.

When a bit excluding unnecessary bits of the voltage seeing code MRS3<4:10>, for example, the most significant bit MSB of the voltage setting code MRS3<4:10> has no relation with the voltage level, only the other bits MRS3<4:9> excluding the MSB may be applied to the enable setting logic unit 220.

While the present invention has been described with respect to the specific embodiments, it will be apparent to those skilled in the art that various changes and modifications may be made without departing from the spirit and scope of the invention as defined in the following claims.

What is claimed is:

1. A semiconductor device comprising:
   an internal voltage generation unit configured to generate an internal voltage in response to an enable signal;
   an enable setting logic unit configured to define a starting time point for generating the internal voltage in response to the enable signal;
   a monitoring unit configured to monitor whether or not the internal voltage reaches a target level in response to the enable signal, and define an ending time point for generating the internal voltage in response to the monitoring result; and
   a measurement result signal generation unit configured to generate a measurement result signal corresponding to a developing time of the internal voltage in response to an output signal of the enable setting logic unit and an output signal of the monitoring unit.

2. The semiconductor device of claim 1, wherein the internal voltage comprises an internal reference voltage used in an Internal circuit.

3. The semiconductor device of claim, further comprising a pad configured to provide the measurement result signal to the outside.

4. The semiconductor device of claim 3, wherein the measurement result signal is provided as a DC-level signal.

5. A semiconductor device comprising:
   an internal voltage generation unit configured to generate an internal voltage in response to an enable signal and a voltage setting code;
   an enable setting logic unit configured to define a starting time point for generating the internal voltage in response to the enable signal and the voltage setting code;
   a comparison reference voltage generation unit configured to generate a comparison reference voltage in response to the enable signal;
   a comparison unit configured to compare the internal voltage with the comparison reference voltage and define an ending time point for generating the internal voltage in response to the comparison result; and
   a measurement result signal generation unit configured to output a developing time of the internal voltage corresponding to a voltage level duration defined by the voltage setting code as a measurement result signal in response to an output signal of the enable setting logic unit and an output signal of the comparison unit.

6. The semiconductor device of claim 5, wherein the internal voltage comprises an internal reference voltage used in an internal circuit.

7. The semiconductor device of claim 5, further comprising a pad configured to provide the measurement result signal to the outside.

8. The semiconductor device of claim 5, wherein the comparison reference voltage generation unit comprises:

a divided voltage generation section configured to generate a plurality of divided voltages in response to the enable signal; and
a selection section configured to output any one of the divided voltages as the comparison reference voltage in response to a voltage select code.

9. The semiconductor device of claim 8, wherein the divided voltage generation section comprises:
   a divider configured to divide a voltage supplied between a high source voltage terminal and a low source voltage terminal at a predetermined division ratio to generate the plurality of divided voltages;
   a first switch configured to selectively couple the high source voltage terminal to one end of the divider in response to the enable signal; and
   a second switch configured to selectively couple the low source voltage terminal to the other end of the divider in response to the enable signal.

10. The semiconductor device of claim 7, wherein the measurement result signal is provided as a DC-level signal.

11. The semiconductor device of claim 7, wherein the measurement result signal generation unit comprises:
    a pull-up driving section configured to drive the pad to a high source voltage in response to an output signal of the enable setting logic unit; and
    a pull-down driving section configured to drive the pad to a low source voltage in response to an output signal of the comparison unit.

12. A method for driving a semiconductor device, comprising:
    generating an internal voltage at a lower voltage level in response to a first voltage setting code when an enable signal is activated;
    defining a starting time point for generating the internal voltage, and developing the internal voltage to an upper voltage level in response to the second voltage setting code when the first voltage setting code is changed to a second voltage setting code;
    monitoring whether the internal voltage reaches the upper voltage level or not, and defining an ending time point for generating the internal voltage in response to the monitoring result; and
    generating a measurement result signal in response to the starting time point and the ending time point for generating the internal voltage.

13. The method of claim 12, wherein the generating of the measurement result signal comprises:
    providing a developing time of the internal voltage, corresponding to a duration for the lower voltage level to reach the upper voltage level, as the measurement result signal to the outside.

14. The method of claim 12, wherein the measurement result signal is provided as a DC-level signal.

15. The method of claim 12, wherein the internal voltage comprises an internal reference voltage used in an internal circuit.

16. The method of claim 12, wherein the defining of the ending time point for generating the internal voltage comprises:
    generating a plurality of divided voltages in response to the enable signal;
    selecting any one of the divided voltages as a comparison reference voltage; and
    comparing the comparison reference voltage with the internal voltage and defining the ending time point for generating the internal voltage in response to the comparison result.

* * * * *